(12) United States Patent
Gebara et al.

(10) Patent No.: US 8,102,194 B2
(45) Date of Patent: Jan. 24, 2012

(54) DUAL FREQUENCY DIVIDER HAVING PHASE-SHIFTED INPUTS AND OUTPUTS

(75) Inventors: Fadi H. Gebara, Austin, TX (US); Jente B. Kuang, Austin, TX (US); Abraham Mathews, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/860,302

(22) Filed: Aug. 20, 2010

(65) Prior Publication Data

US 2010/0315132 A1 Dec. 16, 2010

Related U.S. Application Data

(62) Division of application No. 11/970,771, filed on Jan. 8, 2008, now Pat. No. 7,847,618.

(51) Int. Cl.
*H03K 3/01* (2006.01)
(52) U.S. Cl. .................. 327/115; 327/534
(58) Field of Classification Search .......... 327/534–537, 327/254–259, 117–122, 112, 115
See application file for complete search history.

(56) References Cited

U.S. PATENT DOCUMENTS

| | | | |
|---|---|---|---|
| 5,710,526 A | 1/1998 | Nauta et al. | |
| 5,790,609 A | 8/1998 | Swoboda | |
| 5,912,574 A | 6/1999 | Bhagwan | |
| 5,949,267 A * | 9/1999 | Rapeli | 327/238 |
| 6,185,119 B1 | 2/2001 | Haeberli et al. | |
| 6,300,820 B1 | 10/2001 | Fotouhi et al. | |
| 6,486,728 B2 | 11/2002 | Kleveland | |
| 6,573,780 B2 | 6/2003 | Lin et al. | |
| 6,597,235 B2 | 7/2003 | Choi | |
| 6,744,289 B2 * | 6/2004 | Nguyen et al. | 327/115 |
| 7,170,965 B2 | 1/2007 | Chien et al. | |
| 7,173,478 B2 | 2/2007 | Chun | |
| 7,227,809 B2 * | 6/2007 | Kwak | 365/189.15 |
| 7,262,644 B2 | 8/2007 | Lin | |
| 7,403,405 B2 | 7/2008 | Conte et al. | |
| 7,760,010 B2 | 7/2010 | Gebara et al. | |
| 2005/0052220 A1 | 3/2005 | Burgener et al. | |

OTHER PUBLICATIONS

C. Yoo et al., "A Low-Ripple Poly-Si TFT Charge Pump for Driver-Integrated LCD Panel," IEEE Trans. on Consumer Elec., vol. 51, No. 2, pp. 606-610 (May 2005).

* cited by examiner

*Primary Examiner* — Dinh T. Le
(74) *Attorney, Agent, or Firm* — Libby Z. Toub; Jack V. Musgrove

(57) ABSTRACT

A distributed charge pump system uses a delay element and frequency dividers to generate out of phase pump clock signals that drive different charge pumps, to offset peak current clock edges for each charge pump and thereby reduce overall peak power. Clock signal division and phase offset may be extended to multiple levels for further smoothing of the pump clock signal transitions. A dual frequency divider may be used which receives the clock signal and its complement, and generates two divided signals that are 90° out of phase. In an illustrative embodiment the clock generator comprises a variable-frequency clock source, and a voltage regulator senses an output voltage of the charge pumps, generates a reference voltage based on a currently selected frequency of the variable-frequency clock source, and temporarily disables the charge pumps (by turning off local pump clocks) when the output voltage is greater than the reference voltage.

3 Claims, 6 Drawing Sheets

DUAL FREQUENCY DIVIDER HAVING PHASE-SHIFTED INPUTS AND OUTPUTS

CROSS-REFERENCE TO RELATED APPLICATION

This application is a divisional of U.S. patent application Ser. No. 11/970,771 filed Jan. 8, 2008 now U.S. Pat. No. 7,847,618.

BACKGROUND OF THE INVENTION

1. Field of the Invention

The present invention generally relates to voltage supplies for integrated circuits, and more particularly to distributed charge pump systems used to power electronic memory structures such as dynamic random-access memory (DRAM).

2. Description of the Related Art

Power management has become a dominant concern in the development of data processing systems. Excess power usage is not only costly and inefficient, but also leads to heat management problems. These problems are particularly pronounced in computer systems having large amounts of memory. State of the art computer systems typically use dynamic random-access memory (DRAM) which is preferable over other memory structures such as static random-access memory (SRAM) because DRAM is more dense. However, DRAM can be more power intensive in circuit blocks for active power supply generation and refresh. SRAM uses a flip-flop memory cell but DRAM uses a capacitor-based memory cell which, due to current leakage, must be regularly refreshed. DRAM can consume a significant portion of a system's overall power.

Power management has become even more challenging with the advent of new memory technologies like embedded DRAM (eDRAM). This new design relies on the silicon-on-insulator (SOI) technology pioneered by International Business Machines Corp. using deep-trench capacitors. Deep-trench (3-dimensional) capacitors have a reduced footprint on the semiconductor substrate, and an eDRAM array has about one-third the area of a comparable DRAM array. Reducing the size of the memory makes it easier to embed the array on the same integrated circuit chip, e.g., a microprocessor or an application-specific integrated circuit (ASIC), to provide a system-on-a-chip solution. An exemplary commercial microprocessor might devote up to 60% of its surface area to memory. Replacing conventional DRAM with eDRAM cells allows the chip designer to build smaller chips and reduce the length of wire that data must travel as it commutes around the chip, resulting in the fastest memory access times ever recorded. Embedding memory further permits much wider buses and higher operation speeds and, due to the much higher density of eDRAM, larger amounts of memory can potentially be used.

An eDRAM array requires an on-chip power supply having precise high and low voltages (positive and negative) for the word lines that drive the rows of the memory array. The high voltage is used to activate a word line, and the low voltage is for standby. FIG. 1 depicts a conventional power supply for an eDRAM array. Power supply 10 includes a reference generator 12, two regulators 14a, 14b, two pump cores 16a, 16b, and a clock source 18. Clock source 18 (phase-locked loop) provides a single clock signal to each of the pump cores 16a, 16b, for example in the range of 20-300 MHz. Pump core 16a provides a high voltage level $V_{pp}$ to an active voltage rail 20, while pump core 16b provides a low voltage level $V_{wl}$ to a standby voltage rail 22. The high voltage level $V_{pp}$ may be referred to a positive voltage and the low voltage level $V_{wl}$ may be referred to as a negative voltage, but these terms are relative and those skilled in the art will appreciate that both the high and low voltage levels may be positive voltage values. $V_{pp}$ may be in the range of 1.4 to 1.8 volts and $V_{wl}$ may be in the range of −0.3 to −0.7 volts.

Rails 20, 22 have pairs of taps connected to respective word line drivers 24-1, 24-n. Each word line driver 24 is used to activate a corresponding row of memory cells in eDRAM array 26. In this example eDRAM array 26 is 1200 cells wide, i.e., each word line is connected to 1200 cells in that row. A memory address for a requested memory block is decoded by memory control logic (not shown) and the resulting signal is used to activate the appropriate word line driver which then switches the voltage for that word line to $V_{pp}$ while the other word lines are maintained at $V_{wl}$. The switching circuitry within a word line driver 24 uses a separate supply voltage $V_{dd}$ (e.g., around 1.0 volt). Sense lines 28a, 28b connected to the inputs of word line drivers 24 are used to provide feedback to regulators 14a, 14b. Regulators 14a, 14b determine an upper limit of the pump voltages and temporarily disable a pump core if the output voltage exceeds the limit. Reference generator 12 generates an internal stable voltage that is used by regulators 14a, 14b for comparison purposes. Reference generator may be a band gap circuit or voltage divider, or an external reference can be provided.

Various pump designs can be used to deliver the voltages from pump cores 16a, 16b, including for example the Cockcroft-Walton voltage multiplier, the Dickson charge pump, and the Nakagome voltage doubler. The Cockcroft-Walton voltage multiplier uses a ladder network of capacitors and diodes or switches connected to a low voltage input. As a charge cascades through the capacitors it successively increases to finally yield a higher voltage at the output. The Dickson charge pump operates in a similar manner but in the Dickson design the nodes of the diode chain are coupled to the inputs via capacitors in parallel instead of in series. The Nakagome voltage doubler uses switched capacitors whose output nodes are connected to cross-coupled transistors.

Peak electrical current in these charge pumps occurs at the clock signal edges, i.e., rising and falling. While peak current is not particularly troublesome for a single charge pump, it can become excessive in larger systems having multiple charge pumps. For example, a microprocessor chip may include an on-board level 3 (L3) cache memory having 32 megabytes of memory employing 96 charge pumps. If these pumps all run on the same clock signal, charge pump peak power and transient current supply current is multiplied by a factor of 96, which would significantly burden the system power budget and heat sink cost.

Methods have been devised which address peak power consumption in voltage supplies for integrated circuits, but these methods still have various disadvantages. In the construction of application-specific integrated circuits (ASICs), a granular DRAM cell is provided with its own pump and oscillator in a single circuit block. This approach does not work well in high performance systems with large embedded DRAM since instantaneous switching power can still be many times higher. Half-cycle clock edge usage does not affect peak current in switched-capacitor (cross-coupled) charge pumps since both clock phases are already used. In a more recent clock distribution system design (Montecito), a phase-locked loop (PLL) circuit feeds many digital frequency dividers (DFDs) several of which are phase and frequency aligned. Each DFD contains a delay locked loop (DLL) and a state machine that dynamically select among 64 DLL phases. At the second level clock buffer (SLCB) level, regional active deskew phase comparators are used to reduce skews due to process, voltage and temperate variations. Half-rate 0° and 90° differential clocks are multiplied to return to the full rate clock at the SLCB level. This multiplicity of blocks is inefficient for large on-board designs, and also presents problems with variability and the power burden on the clock network itself. In another clock distribution system used for polysilicon thin-film transistor displays, delay elements are employed to achieve phase offsets. This approach requires a time constant match between pump operation and the delay circuit blocks. The delay block is part of the clock excitation path and contributes to pump system power usage. Phase offset by delay stages does not work well for newer technologies (with FO4 delays in the neighborhood of 10 picoseconds) since it may take up to 250 such delay stages to move just one clock edge of a 100 MHz clock by 25% of its period.

On-die regulated voltage level generation is becoming essential to reduce system cost and power delivery complexity in large chips with multiple power islands. In particular, supply generation for eDRAM word lines in server class applications entails special challenges because of the stringent power, performance, cell retention, variability, and distribution requirements. It would, therefore, be desirable to devise an improved charge pump system which can overcome the foregoing problems but still have an efficient energy conversion topology. It would be further advantageous if the system could easily be optimized for active and leakage power.

SUMMARY OF THE INVENTION

It is therefore one object of the present invention to provide an improved clock system for a voltage supply having multiple charge pumps.

It is another object of the present invention to provide such a system which does not entail an excessive number of delay stages but still reduces peak power usage in a distributed charge pump system, particularly one utilizing switched-capacitor charge pumps.

It is yet another object of the present invention to provide such a system which can be further optimized for voltage regulation.

The foregoing objects are achieved in a distributed charge pump system generally comprising first and second charge pumps, a clock generator which provides a first clock signal, a delay element connected to the clock generator which creates a second clock signal that is out of phase with the first clock signal, a first clock divider which receives the first clock signal and generates a first lower-frequency signal that clocks the first charge pump, and a second clock divider which receives the second clock signal and generates a second lower-frequency signal out of phase with the first lower-frequency signal that clocks the second charge pump, to offset peak current clock edges for each charge pump and thereby reduce overall peak power. Preferably, the clock dividers divide the clock frequency by two, the second clock signal is approximately 180° out of phase with the first clock signal, and the second lower-frequency signal is approximately 90° out of phase with the first lower-frequency signal. The clock signal division and phase offset may be extended to multiple levels for further smoothing of the pump clock signal transitions. The clock dividers may be integrated into a dual frequency divider comprising a first input which receives a first clock signal, a second input which receives a second clock signal that is out of phase with the first clock signal (e.g., 180°), a first divider circuit connected to said first and second inputs which generates a first divided signal having a frequency less than that of the first clock signal (e.g., half), and a second divider circuit connected to said first and second inputs which generates a second divided signal having a frequency equal to that of the first divided signal and out of phase with the first divided signal (e.g., 90°). The dual frequency divider outputs may be selectively disabled.

The charge pumps may be switched-capacitor charge pumps. In an illustrative embodiment the clock generator comprises a variable-frequency clock source including a 2 GHz source signal and a controllable frequency divider that selectively divides the source signal by 4, 8 or 16, to generate intermediate clock frequencies at 500 MHz, 250 MHz, or 125 MHz. The clock generator may further include a frequency-tunable oscillator, and a multiplexer which selects between the clock source and the oscillator to output the first clock signal. The charge pump system may further include a voltage regulator which senses an output voltage of the charge pumps, generates a reference voltage based on a currently selected frequency of the variable-frequency clock source, and temporarily disables the charge pumps (by turning off local pump clocks) when the output voltage is greater than the reference voltage.

The above as well as additional objectives, features, and advantages of the present invention will become apparent in the following detailed written description.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Figure 1:
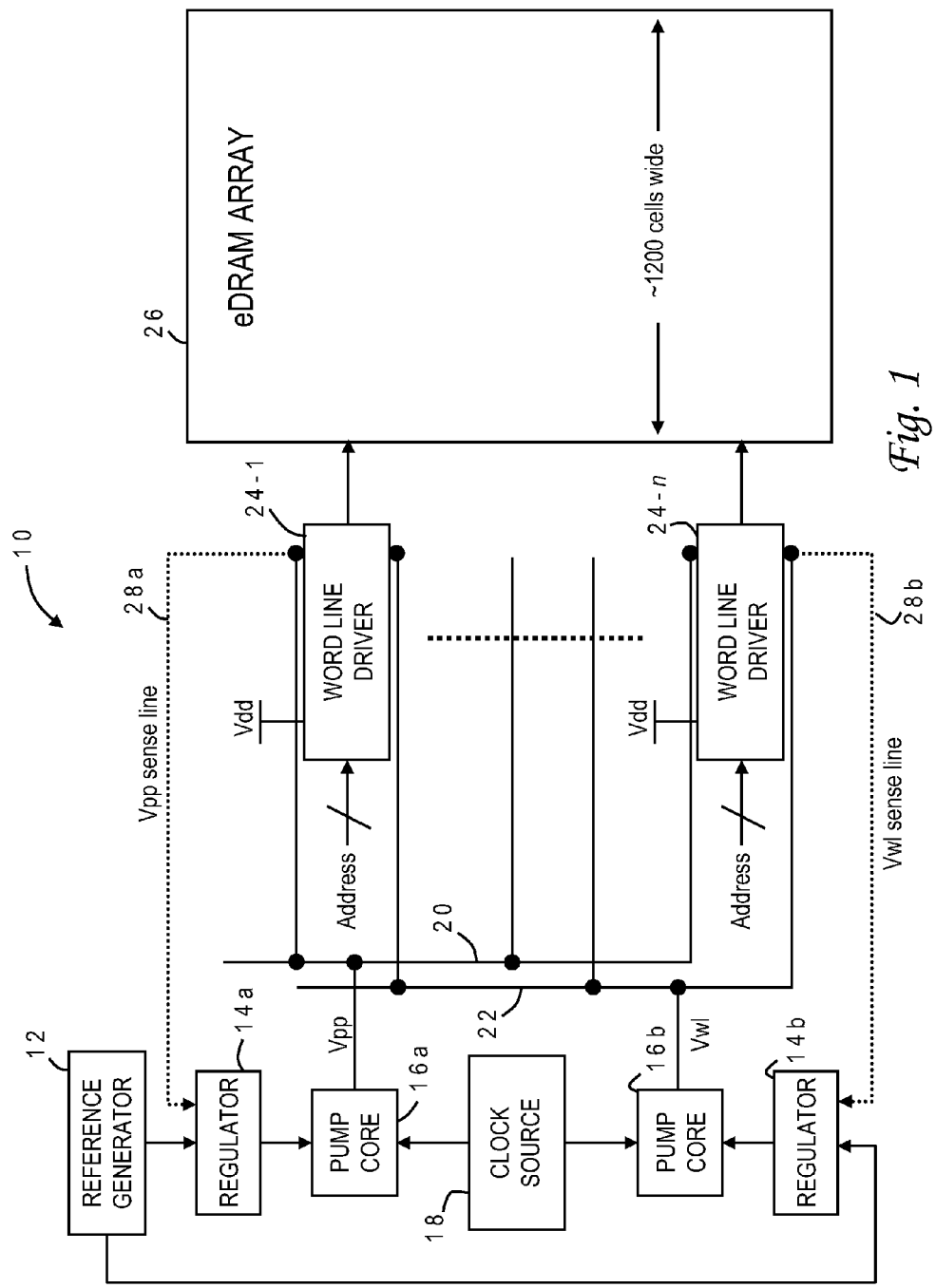
FIG. 1 is a block diagram of a conventional power supply circuit for driving word lines of an embedded dynamic random-access memory (eDRAM) array.
Figure 2:
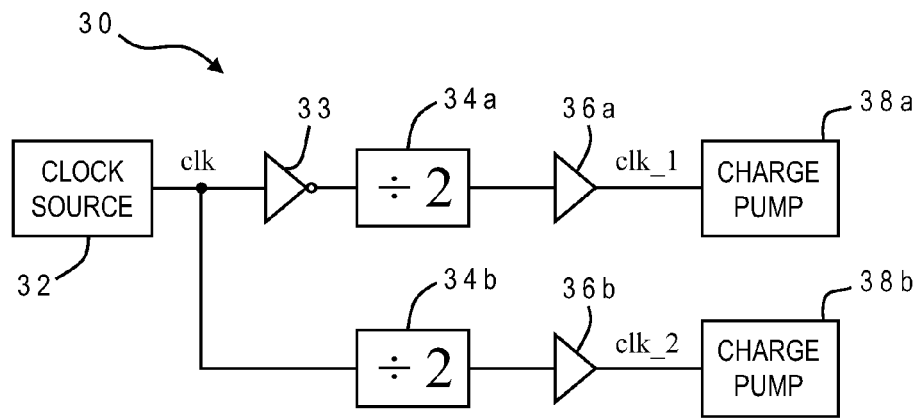
FIG. 2 is a high-level schematic diagram of a clock circuit for a distributed charge pump system constructed in accordance with one embodiment of the present invention.

With reference now to the figures, and in particular with reference to FIG. 2, there is depicted a simplified embodiment 30 of a distributed charge pump system constructed in accordance with the present invention. Distributed charge pump system 30 is generally comprised of a clock source 32, a delay element 33 which receives the clock signal "clk" from clock source 32, a first frequency divider 34a which receives a delayed clock signal from delay element 33, a second frequency divider 34b which receives the undelayed clock signal from clock source 32, two buffers 36a, 36b respectively connected to the outputs of frequency dividers 34a, 34b, and two charge pumps 38a, 38b driven by respective clock signals "clk_1" and "clk_2" from buffers 36a, 36b. Clock source 32 may for example be a phase-lock loop circuit utilizing an oscillator. Delay element 33 is an inverter in this embodiment but may comprise other circuit structures which exhibit a known delay in conveying the clock signal. Dividers 34a, 34b in this embodiment divide the frequency by a divisor of two but other divisors could be used; exemplary details for the dividers are discussed below in conjunction with FIGS. 5A, 5B and 6. Buffers 36a, 36b are used only for timing adjustment and are not necessary for the most basic implementation of the invention. Distributed charge pump system 30 is part of an integrated circuit (IC) chip, and charge pumps 38a and 38b are used to supply regulated voltages to other circuit components on the same IC chip such as an embedded dynamic random-access memory (eDRAM) array. The charge pump clock network is separate from the functional clock for the eDRAM array.

Figure 3:
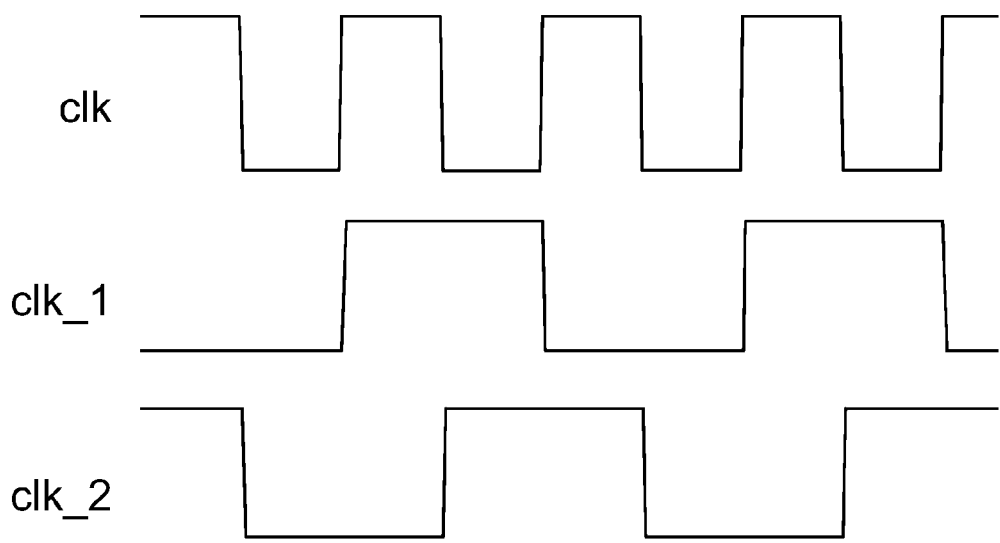
FIG. 3 is a timing diagram for the three clock signals shown in FIG. 2.

FIG. 3 is a timing diagram for the three clock signals illustrated in FIG. 2. The front-end clock delay produces approximately 90° phase separation in the "clk" signal to offset peak current clock edges for each pump cluster, which minimizes aggregate peak AC currents at any given moment. In this implementation the "clk_1" signal transitions (rises or falls) approximately halfway in time between the transitions of the "clk_2" signal, and vice-versa, but the invention contemplates other phase differences as well.

Figure 4:
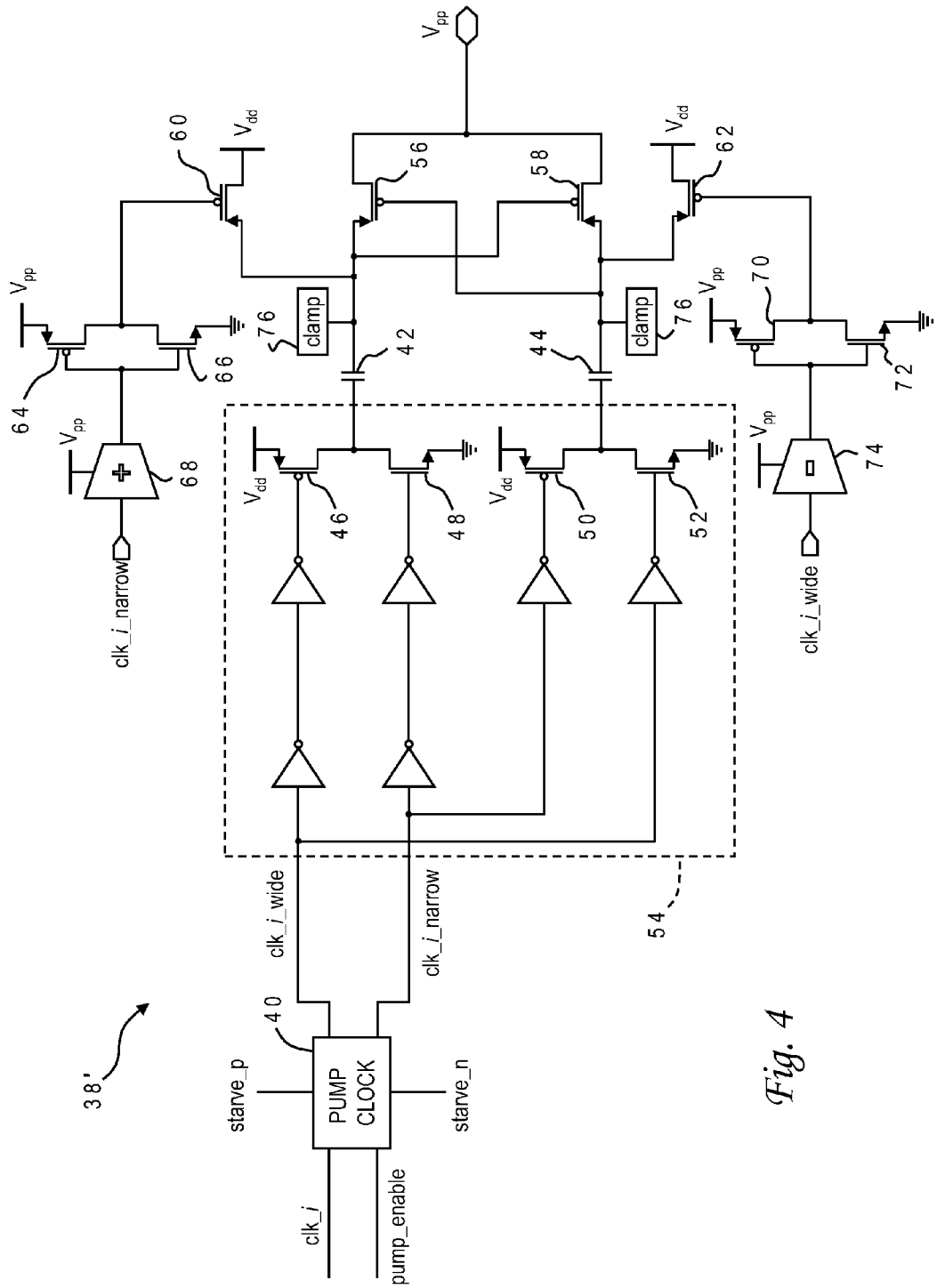
FIG. 4 is a detailed schematic diagram of one embodiment of a switched-capacitor charge pump that may be used in the distributed charge pump system of the present invention.

Charge pumps 38a, 38b are preferably designed with an internal slew-optimized voltage doubling topology, cross-coupled to transfer charges efficiently during both clock phases. One example of a positive pump engine 38' which may be used with the present invention is illustrated in further detail in FIG. 4. Positive pump engine 38' includes two switched capacitors 42, 44. Capacitors 42, 44 are preferably deep-trench capacitors. Their capacitance may vary depending upon the desired pump capacity, i.e., the ability to maintain the desired voltage across the output rail for a sustained load. In the illustrative embodiment the capacitance is around 50-1000 picofarad.

The input node of capacitor 42 is coupled to a power supply voltage $V_{dd}$ by a p-type metal oxide semiconducting (PMOS) transistor 46 and to electrical ground by an n-type metal oxide semiconducting (NMOS) transistor 48. PMOS transistor 46 is controlled by a first gating signal derived from a first clock signal "clk_i_wide" and NMOS transistor 48 is controlled by a second gating signal derived from a second clock signal "clk_i_narrow". The duty cycle of the "clk_i_wide" signal is greater than 50% while the duty cycle of the "clk_i_narrow" is less than 50%. The two signals are non-overlapping for break-before-make switching to avoid leakage. Each of these clock signals pass through a series of buffers (inverters) which provide a desired time delay.

The input node of capacitor 44 is similarly coupled to the power supply voltage $V_{dd}$ by another PMOS transistor 50 and to electrical ground by another NMOS transistor 52. PMOS transistor 50 is controlled by a third gating signal derived from the "clk_i_narrow" signal and NMOS transistor 52 is controlled by a fourth gating signal derived from the "clk_i_wide" signal. The clock signals again pass through one or more buffers or inverters which provide a desired time delay such that the input node of capacitor 42 is charging (connected to $V_{dd}$) when the input node of capacitor 44 is discharging (connected to ground) during the first clock phase, and the input node of capacitor 44 is charging when the input node of capacitor 42 is discharging during the second clock phase.

The pumping devices 46, 48, 50, 52 are preferably of non-body contact type to conserve area. The region 54 containing the inverters and pumping devices (the charging circuit) is preferably thin-oxide in order to support lower voltages. This two-phase inverter topology combined with the use of wide and narrow clock signals provides superior clock edge control while reducing clock loading, and is relatively compact.

Two cross-coupled PMOS transistors 56, 58 are respectively connected to the output nodes of capacitors 42, 44. The source terminals of transistors 56, 58 are interconnected to provide the output voltage $V_{pp}$ of the charge pump. Each output node is also coupled to a reference voltage by respective PMOS transistors 60, 62; for the positive pump embodiment this reference voltage is the power supply voltage $V_{dd}$. The gate of PMOS transistor 60 is coupled to the pump output voltage $V_{pp}$ by a PMOS transistor 64 and to electrical ground by an NMOS transistor 66. The gates of PMOS transistor 64 and NMOS transistor 66 are in turn controlled by the output of a level shifter 68. The high voltage rail of level shifter 68 is connected to the pump output voltage $V_{pp}$. Level shifter 68 has a positive polarity and its input is the "clk_i_narrow" signal. The gate of PMOS transistor 62 is similarly coupled to the pump output voltage $V_{pp}$ by another PMOS transistor 70 and to electrical ground by another NMOS transistor 72. The gates of PMOS transistor 70 and NMOS transistor 72 are in turn controlled by the output of another level shifter 74. The high voltage rail of level shifter 74 is connected to the pump output voltage $V_{pp}$. Level shifter 74 has a negative polarity (its output is the logical complement of the input) and its input is the "clk_i_wide" signal. This topology for the side charging devices 60, 62 provides a particularly well-regulated voltage level output. The output nodes of each capacitor 42, 44 are also connected to clamp circuits 76 which are used in an override mode to disable the charge pumps.

A local pump clock circuit 40 is used to generate the "clk_i_wide" and "clk_i_narrow" signals. Two adjustable signals "starve_p" and "starve_n" control the edge separation for the "clk_i_wide" and "clk_i_narrow" signals. A pump enable signal ("pump_en") is used for the override (clamp) mode; during normal operation of the charge pump the pump enable signal is turned on. When disabled ("pump_en" turned off), wide output is set to 1 and narrow output is set to 0 to shut off both phases of the charge pump.

A negative pump engine analog to positive pump engine 38' may be constructed to provide a low level regulated voltage ($V_{wl}$) by switching the polarities and inputs of the level shifters and switching the reference voltages for the side transistors. Further details regarding the construction and operation of the positive and negative pump engines, pump clock 40, level shifters 68, 74, clamps 76, alternative designs for charge pumps, and other features may be found in U.S. patent application Ser. No. 11/927,784 which is hereby incorporated. Those skilled in the art will appreciate however that the present invention is not limited to any specific charge pump construction. For example, inverted pump clock inputs can be fed to two single-ended pumps that share the same clock source.

Figure 5A:
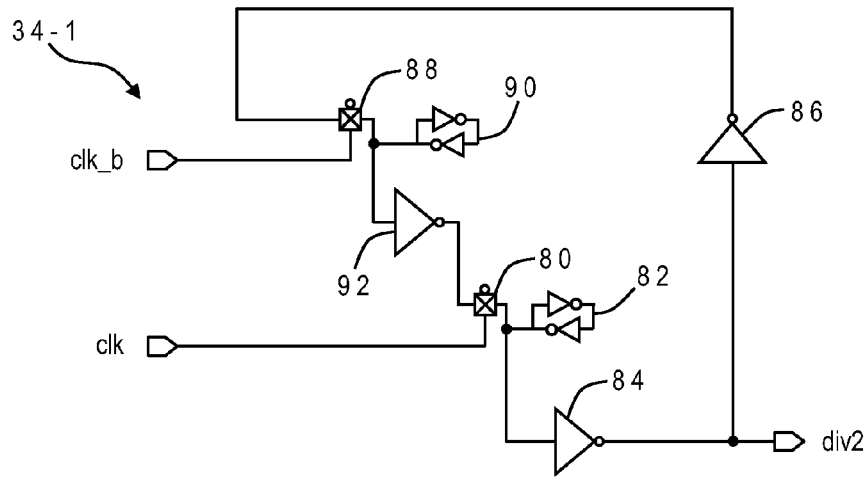
FIGS. 5A and 5B are high-level schematic diagrams of alternative constructions for a frequency divider that may be used in the distributed charge pump system of the present invention.
Figure 5B:
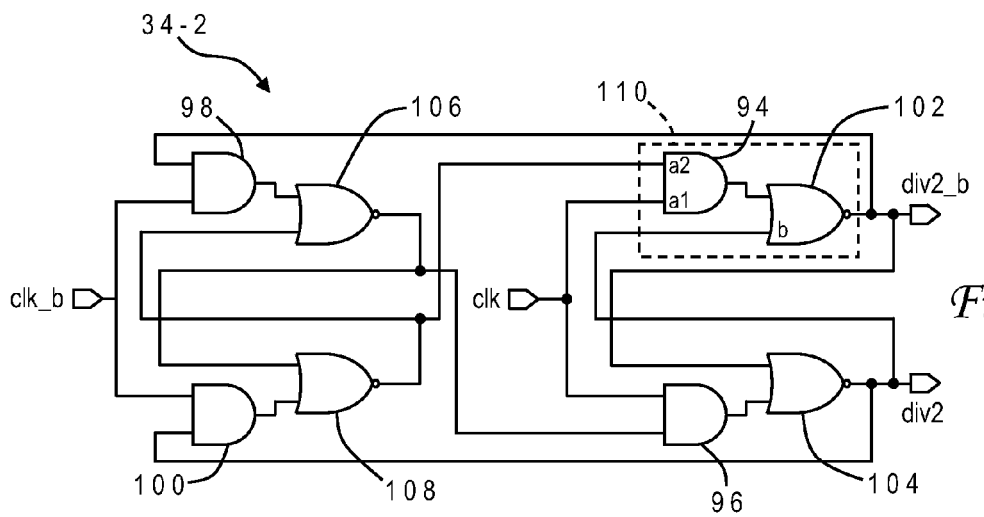

Two alternative designs for the frequency dividers are depicted in FIGS. 5A and 5B. In both of these designs, frequency division is essentially accomplished by feeding the inverted output of a slave stage latch back to the input of a master stage latch. The clock signal "clk" for frequency divider 34-1 shown in FIG. 5A is connected to the control line of a transmission gate 80 (nfet/pfet), i.e., transmission gate 80 is conducting when "clk" is active. Its output is connected to a storage cell 82 (flip-flop) and to an inverter 84. The output of inverter 84 is fed back through another inverter 86 to the input of a second transmission gate 88 which is controlled by the complement of the clock signal "clk_b". The output of transmission gate 88 is connected to another storage cell 90 and to a third inverter 92. The output of inverter 92 is connected to the input of transmission gate 80. The output of inverter 84 is the output of divider 34-1, the "div2" signal which has half the frequency of the "clk" signal.

In the frequency divider 34-2 shown in FIG. 5B, the clock signal "clk" is an input to two AND gates 94, 96, and the invert clock signal "clk_b" is an input to another two AND gates 98, 100. The output of each AND gate 94, 96, 98, 100 is connected to one input of a respective NOR gate 102, 104, 106, 108. The outputs of NOR gates 102, 104 are cross-coupled to their other inputs, as are the outputs of NOR gates 106 and 108. The output of NOR gate 102 is also connected to an input of AND gate 98, and the output of NOR gate 104 is also connected to an input of AND gate 100. The output of NOR gate 106 is also connected to an input of AND gate 96, and the output of NOR gate 108 is also connected to an input of AND gate 94. The output of NOR gate 104 is the true output of divider 34-2, the "div2" signal which has half the frequency of the "clk" signal; the output of NOR gate 102 is the complement output "div2_b".

Figure 6:
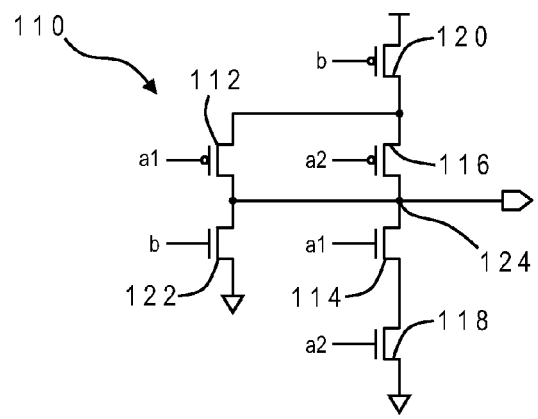
FIG. 6 is a detailed schematic diagram for the AND/NOR gate combination logic shown in FIG. 5B.

The AND/NOR gate combination logic 110 of FIG. 5B is preferably implemented as further illustrated in FIG. 6. The two inputs to the AND gate are designated as a1 and a2, while the second (cross-coupled) input to the NOR gate is designated as b. Input a1 is connected to the gate of a pfet (p-type field-effect transistor) 112 and to the gate of an nfet (n-type field-effect transistor) 114. Input a2 is connected to the gate of a pfet 116 and to the gate of an nfet 118. Input b is connected to the gate of a pfet 120 and to the gate of an nfet 122. The drain of pfet 120 is connected to the network power supply ($V_{dd}$) and its source is connected to the drains of pfets 112 and 116. The source of pfet 112 is connected to the drain of nfet 122 and to a node 124 which also connects to the source of pfet 116 and to the drain of nfet 114. The source of nfet 114 is connected to the drain of nfet 118. The sources of nfets 118 and 122 are connected to electrical ground. The signal at node 124 is the output of the circuit, i.e., the output of the NOR gate in the AND/NOR gate combination logic 110. This construction is more compact than separate AND and NOR gates, but is not to be construed in a limiting sense as other circuit designs may be used in the dividers, and those skilled in the art will again appreciate that the present invention is not limited to any specific frequency divider construction.

Figure 7:
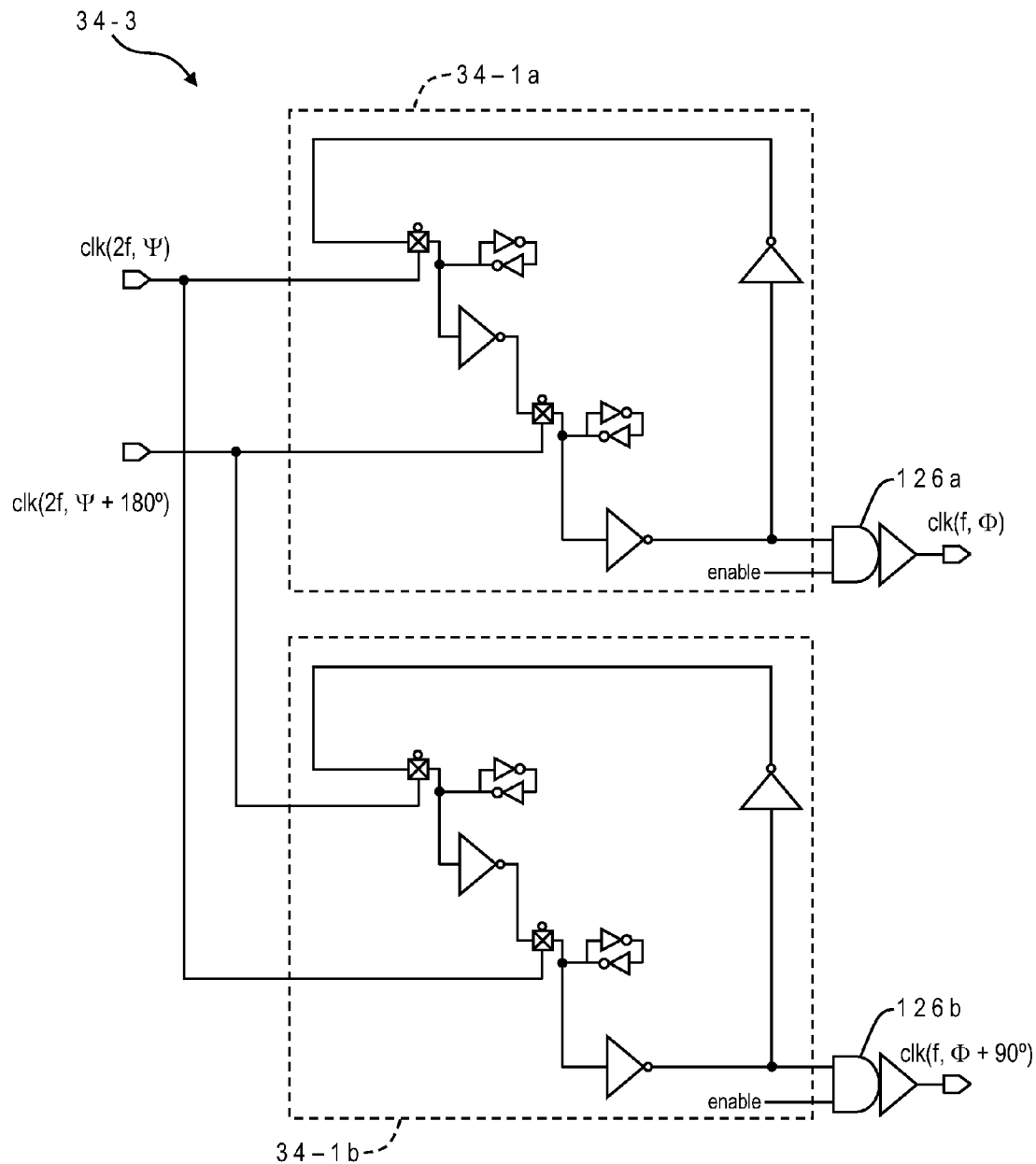
FIG. 7 is a high level schematic diagram of a preferred embodiment for a dual frequency divider that may be used in the distributed charge pump system of the present invention.

While distributed charge pump system 30 utilizes two separate frequency dividers 34a, 34b as shown in FIG. 2, the invention may instead advantageously utilize a dual frequency divider as illustrated in FIG. 7. Dual frequency divider 34-3 employs two frequency divider circuits 34-1a and 34-1b that share a single pair of clock inputs. In frequency divider circuit 34-1a the forward transmission gate is controlled by signal "clk(2f, Ψ+180°)" and the feedback transmission gate is controlled by signal "clk(2f, Ψ)". In frequency divider circuit 34-1b the forward transmission gate is controlled by signal "clk(2f, Ψ)" and the feedback transmission gate is controlled by signal "clk(2f, Ψ+180°)". The output of frequency divider circuit 34-1a is signal "clk(f, Φ)", and the output of frequency divider circuit 34-1b is signal "clk(f, Φ+90°)" (f represents clock frequency, and Ψ and Φ represent clock phases). Thus, dual frequency divider 34-3 receives a clock signal and its complement as inputs, and generates two outputs which are 90° out of phase and have half the frequency of the original clock signal. This construction has the further advantage of preventing loop oscillations when the input clock is disabled since the forward transmission gate in one divider circuit will be off while the feedback transmission gate in the other divider circuit will simultaneously be off. The outputs may optionally be buffered, or may be connected to respective buffered AND gates 126a, 126b which are used to disable dual frequency divider 34-3 using an "enable" signal input, in order to suppress phase effects and latch set-up time differences.

Figure 8:
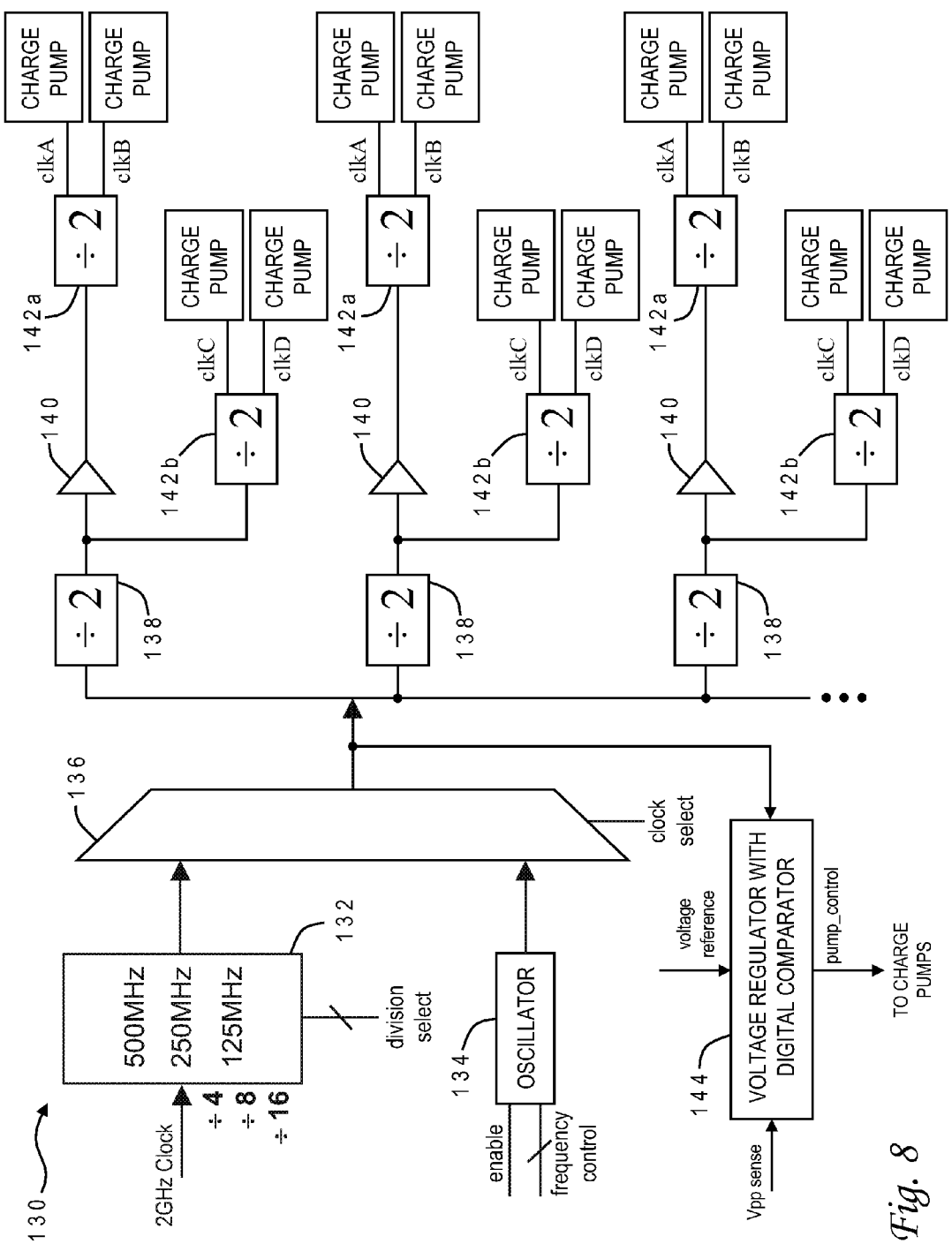
FIG. 8 is a high-level schematic diagram of a clock circuit for a distributed charge pump system constructed in accordance with a more sophisticated embodiment of the present invention.

A more sophisticated embodiment of a clock network for a distributed charge pump system using the present invention is shown in FIG. 8. Clock network 130 includes a controllable divider 132, a small, frequency-tunable oscillator 134, a multiplexer 136 which receives inputs from controllable divider 132 and frequency-tunable oscillator 134, a plurality of first-level frequency dividers 138 which receive the output of multiplexer 136, a plurality of delay elements (buffers) 140 connected to respective first level frequency dividers 138, and a plurality of second-level frequency dividers 142a, 142b wherein second-level frequency dividers 142a receive an input from a respective buffer 140 and second-level frequency dividers 142b receive an input from a respective first-level frequency divider 138. Each second-level frequency divider 142a, 142b clocks a separate charge pump.

In this implementation first-level frequency dividers 138 are single-ended, and second-level frequency dividers have two phase-shifted outputs, e.g., using dual frequency dividers 34-3. Buffers 140 add 90° of phase to the clock input for second-level frequency dividers 142a, with the result that transitions for the four clock signals "clkA", "clkB", "clkC", "clkD" of a single pump cluster are interleaved, i.e., offset at eight different phases. This smoothing of peak power usage yields significant power reduction in systems having large numbers of charge pumps, e.g., an on-chip cache memory for a microprocessor. The frequency dividers also conveniently act as local (or sector) clock buffers. Those skilled in the art will appreciate that this multi-level use of dividers can be further expanded to more than two levels, and in more complex embodiments the dividers can have divisors greater than two.

Charge pump efficiency is related to clock frequency, and the present invention may easily be adapted to take advantage of this dependency by providing controllable divider 132 as a variable-frequency clock source. Experimentation suggests that the most efficient frequency range for a reference voltage ($V_{dd}$) of 0.8 to 1.0 volts is roughly 100-500 MHz, so in this embodiment controllable divider 132 receives a 2 GHz clock signal and selectively divides that signal by a divisor of 4, 8 or 16, to generate intermediate clock frequencies at 500 MHz, 250 MHz, or 125 MHz. The divisor may be selected at the factory or in response to a run-time determination. The flexibility of the clock generator frequency allows for pump efficiency optimization in the event of variations in hardware characteristics.

The further inclusion of frequency-tunable oscillator 134 facilitates burn-in, very low-frequency array functional testing, and other similar situations. Under those conditions, the pump clock is supplied from the on-chip oscillator via selection by multiplexer 136 to maintain pump efficiency and desired voltage level. When implemented in localized fashions, oscillators can be designed with preset start-up states to provide known phase offsets between different localities.

Pumped voltage levels may be further regulated in various manners, such as by comparing the divided sense point voltage to a reference level, and turning each pump on and off by enabling or disabling its clock accordingly. A voltage regulator 144 is used for this purpose. Voltage regulator 144 receives the clock signal from multiplexer 136 and compares a reference level to the sensed voltage ($V_{pp}$) using a comparator. Although any sensitive comparator will suffice, the comparator is preferably one of the reduced-jitter digital comparators described in U.S. patent application Ser. No. 11/464,672 which is hereby incorporated. The reference voltage may vary considerably depending upon the pump design, in the range of 0 volts (ground) to the power supply voltage ($V_{dd}$). The sense voltage is sampled according to the intermediate frequency output of controllable divider 132, i.e., at a frequency that is higher than the local pump clock frequency but lower than the clock frequency for the powered electronic structure, e.g., the eDRAM array. If the sensed voltage is greater than the indicated reference level, the "pump_control" signal is activated to temporarily turn off the charge pumps (by disabling the clock signals from pump clock 40).

To prevent a high-power condition due to delays in comparator decision registration, a latch structure which regulates switching thresholds may be incorporated prior to the pump clock enable feed. To control ripples, each pump output may also employ deep-trench capacitors, in addition to distributed deep-trench capacitors and circuit loads on the distribution grids. Multiple feedback sense points can be taken from calculated locations in a word line grid ($V_{pp}$ and $V_{wl}$) to control the pump duty cycle and minimize RC drops. A 15KΩ shunt to $V_{dd}$ or ground may be added to individual positive and negative pump outputs, respectively, to block low-frequency noise and ringing.

The present invention thus significantly reduces peak power consumption in distributed charge pump system, with low overhead and low cost. The resulting power profile is highly controllable and predictable. In particular the invention is very useful for an on-chip, word line dual supply generation system for 45 nm SOI eDRAM technology. This adaptive on-chip voltage solution greatly enhances eDRAM operation and scalability.

Although the invention has been described with reference to specific embodiments, this description is not meant to be construed in a limiting sense. Various modifications of the disclosed embodiments, as well as alternative embodiments of the invention, will become apparent to persons skilled in the art upon reference to the description of the invention. It is therefore contemplated that such modifications can be made without departing from the spirit or scope of the present invention as defined in the appended claims.

What is claimed is:

1. A dual frequency divider circuit comprising:
a first input which receives a first clock signal;
a second input which receives a second clock signal having a frequency equal to that of the first clock signal and out of phase with the first clock signal;
a first divider circuit connected to said first and second inputs which generates a first divided signal having a frequency less than that of the first clock signal, said first divider circuit including
a first transmission gate controlled by said first input,
a first storage cell connected to an output of said first transmission gate,
a first inverter having an input connected to said output of said first transmission gate,
a second inverter having an input connected to an output of said first inverter,
a second transmission gate having an input connected to an output of said second inverter, and controlled by said second input,
a second storage cell connected to an output of said second transmission gate,
a third inverter having an input connected to said output of said second transmission gate, and an output connected to an input of said first transmission gate, and
a first divider output connected to said output of said first inverter; and
a second divider circuit connected to said first and second inputs which generates a second divided signal having a frequency equal to that of the first divided signal and out of phase with the first divided signal, said second divider circuit including
a third transmission gate controlled by said second input,
a third storage cell connected to an output of said third transmission gate,
a fourth inverter having an input connected to said output of said third transmission gate,
a fifth inverter having an input connected to an output of said fourth inverter,
a fourth transmission gate having an input connected to an output of said fifth inverter, and controlled by said first input,
a fourth storage cell connected to an output of said fourth transmission gate,
a sixth inverter having an input connected to said output of said fourth transmission gate, and an output connected to an input of said third transmission gate, and
a second divider output connected to said output of said fourth inverter.

2. The dual frequency divider circuit of claim 1 wherein:
the second clock signal is approximately 180° out of phase with the first clock signal;
the second divided signal is approximately 90° out of phase with the first divided signal; and
the first and second divided signals have a frequency which is approximately half that of the first clock signal.

3. The dual frequency divider circuit of claim 1 wherein said first and second divider circuits have gated outputs which are selectively disabled using an enable signal.

* * * * *